United States Patent [19]
Okazaki et al.

[11] Patent Number: 5,699,283
[45] Date of Patent: Dec. 16, 1997

[54] LOGIC EMULATION SYSTEM

[75] Inventors: Yoshinobu Okazaki; Osamu Tada, both of Hadano, Japan

[73] Assignee: Hitachi, Ltd., Tokyo, Japan

[21] Appl. No.: 483,987

[22] Filed: Jun. 7, 1995

[30] Foreign Application Priority Data

Sep. 9, 1994 [JP] Japan .................... 6-215593

[51] Int. Cl.$^6$ .................................................. G06F 17/50
[52] U.S. Cl. .......................................... 364/578; 364/488
[58] Field of Search ........................... 364/488, 489, 364/490, 578; 395/500

[56] References Cited

U.S. PATENT DOCUMENTS

| | | | |
|---|---|---|---|
| 5,036,473 | 7/1991 | Butts et al. | 364/489 |
| 5,253,181 | 10/1993 | Marui et al. | 364/489 |
| 5,414,638 | 5/1995 | Verheyen et al. | 364/489 |
| 5,422,823 | 6/1995 | Agrawal et al. | 364/489 |
| 5,452,227 | 9/1995 | Kelsey et al. | 364/489 |
| 5,452,231 | 9/1995 | Butts et al. | 364/489 |
| 5,469,368 | 11/1995 | Agrawal et al. | 364/489 |
| 5,499,191 | 3/1996 | Young | 364/489 |

OTHER PUBLICATIONS

Nikkei Electronics, No. 557, Jun. 22, 1992, pp. 203–217.

Primary Examiner—Vincent N. Trans
Attorney, Agent, or Firm—Fay, Sharpe, Beall, Fagan, Minnich & McKee

[57] ABSTRACT

A logic emulation system that verifies a target logic circuit and evaluates its performance efficiently divides the design data of a target logic circuit into a plurality of small-scale logic circuits and a connection circuit for interconnecting the small-scale logic circuits, thereby creating an equivalent circuit of the target logic circuit. The logic emulation system judges, when a logical design change to the target logic circuit prompts the comparison of the data of the equivalent circuit of the logic circuit before the logical change with the data after the logical change, whether it is feasible to implement the design data on the logically changed logic circuit by adding one or more small-scale logic circuits, and by altering the connection circuit accordingly. When the implementation of the design data on the logically changed logic circuit is judged to be feasible, the equivalent circuit of the logically changed logic circuit is generated by resorting to the above measures and without modifying the existing equivalent circuit.

16 Claims, 10 Drawing Sheets

FIG. 8(a)
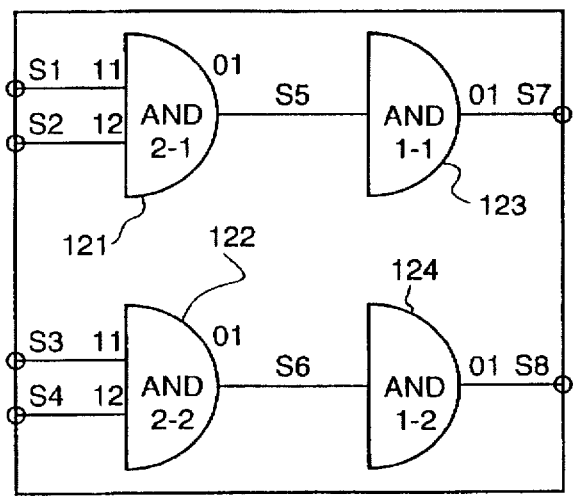
FIG. 8(b)
| AND2-1 | I1=S1 | I2=S2 | O1=S5 |
| AND2-2 | I1=S3 | I2=S4 | O1=S6 |
| AND1-1 | I1=S5 | | O1=S7 |
| AND2-2 | I1=S6 | | O1=S8 |
FIG. 8(c)
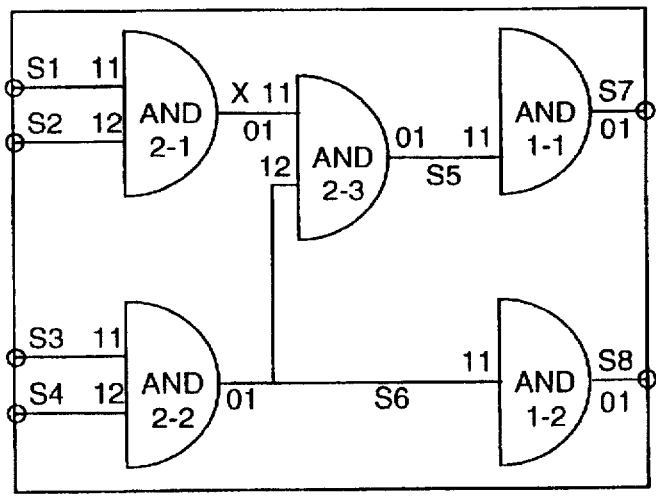
FIG. 8(d)
| AND2-1 | I1=S1 | I2=S2 | O1=X |
| AND2-2 | I1=S3 | I2=S4 | O1=S6 |
| AND2-3 | I1=X | I2=S6 | O1=S5 |
| AND1-1 | I1=S5 | | O1=S7 |
| AND1-2 | I1=S6 | | O1=S8 |

| FUNCTION BLOCK NUMBER | INPUT | | OUTPUT |
|---|---|---|---|
| | I1 | I2 | O1 |
| 1 | 0 | 0 | 0 |
| 1 | 0 | 1 | 0 |
| 1 | 1 | 0 | 0 |
| 1 | 1 | 1 | 1 |
| 2 | 0 | 0 | 0 |
| 2 | 0 | 1 | 0 |
| 2 | 1 | 0 | 0 |
| 2 | 1 | 1 | 1 |

| FUNCTION BLOCK NUMBER | INPUT | | OUTPUT |
|---|---|---|---|
| | I1 | I2 | O1 |
| 1 | 0 | - | 0 |
| 1 | 1 | - | 1 |
| 2 | 0 | - | 0 |
| 2 | 1 | - | 1 |

| FUNCTION BLOCK NUMBER | INPUT | | OUTPUT |
|---|---|---|---|
| | I1 | I2 | O1 |
| 1 | 0 | 0 | 0 |
| 1 | 0 | 1 | 0 |
| 1 | 1 | 0 | 0 |
| 1 | 1 | 1 | 1 |

|    | X1 | X2 | X3 | X4 |
|----|----|----|----|----|
| Y1 | 0  | 0  | 1  | 0  |
| Y2 | 0  | 0  | 1  | 0  |
| Y3 | 0  | 0  | 1  | 0  |
| Y4 | 0  | 0  | 1  | 0  |

|    | X1 | X2 | X3 | X4 |
|----|----|----|----|----|
| Y1 | 1  | 0  | 0  | 0  |
| Y2 | 0  | 0  | 0  | 1  |
| Y3 | 0  | 0  | 1  | 0  |
| Y4 | 0  | 1  | 1  | 0  |

LOGIC EMULATION SYSTEM

BACKGROUND OF THE INVENTION

1. Field of the Invention

The present invention relates to a logic emulation system that uses a plurality of component parts on a printed-circuit board to implement equivalent operations of logic circuits in LSIs (large-scale integrated circuits) and computers, thereby emulating the logical operations of these logic circuits.

2. Description of the Related Art

Logic circuits in LSIs and computers are verified traditionally by resorting to logic simulation and through trial manufacture of LSI boards. Logic simulation involves, illustratively, the implementation of the operations of the target logic circuit by use of a computer. One disadvantage of such computer-based logic simulation is that, because the simulation setup operates at very low speeds compared with actual logic circuits, verification takes more time as the scope of the logic circuit in question increases. Where an LSI board is to be produced for trial, several weeks are often required to wire and arrange the LSIs on the board. Thus, it is practically impossible to produce such test setups repeatedly for verification purposes. For this reason, logic emulation for circumventing the above deficiencies of the prior art is drawing increased attention.

Logic emulation utilizes a plurality of component parts mounted on a printed-circuit board to implement equivalent operations of the logic circuits in LSIs and computers. The LSI board setup is operated at a speed close to that of the actual logic circuit for verification. FIG. 2 shows a conventional logic emulation system.

In FIG. 2, design data 110 on the target LSI are input through a workstation 100. In this example, the target LSI is assumed to comprise input/output pins 111 through 116 and gates 121 through 124.

A compiler 130 reads LSI design data and generates therefrom LSI mapping data 140 and PGA (programmable chip array) connection data 150. These two kinds of data are used to produce a programmable gate array (PGA1) 141 and a programmable gate array (PGA2) 142 for performing the equivalent operations of the LSI, and a programmable interconnect device (PID1) 151 for connecting the PGAs.

When the scope of the gates in the target LSI is small, one programmable chip may be sufficient for mapping the gates. However, gates of greater scopes are generally mapped into a plurality of programmable chips. In the example of FIG. 2, gates 121 and 122 are mapped into the programmable chip 141, and gates 123 and 124 are mapped into the programmable chip 142. In logic simulation, the programmable chips 141 and 142 as well as the programmable interconnect chip 151 are mounted on a printed-circuit board 160. For verification, the mounted parts are operated at a speed close to that of the actual logic circuit.

The logic simulation of the above-described type is discussed illustratively in Nikkei Electronics (the Jun. 22 issue, 1992, No. 557, pp. 203-217).

Logic emulation is used not only for logic verification but also for determining the specifications of the target logic circuit. For example, if the logic circuit includes a cache memory, determining the optimum capacity of that memory is an important decision to make, because the greater the capacity of the cache memory, the higher the probability of the desired data residing in that memory. However, boosting the capacity of the cache memory entails one disadvantage: It takes longer to transfer necessary data from main memory to the cache memory if the latter does not have the required data. This means that the capacity of the cache memory needs to be determined optimally in view of the application in which the target logic circuit is to be used. Utilizing logic emulation allows the performance of the target logic circuit to be measured while its cache memory is being varied in capacity until an optimum cache memory capacity is obtained.

Against such a background, the above-described prior art has a major disadvantage: When logic simulation is used to verify the logic of a particular logic circuit or to determine its specifications, even a simple logical change requires modifying the original design data (net list) and, correspondingly, remapping, rearranging and rewiring the programmable chips on the printed-circuit board. This leads to increasing man-hours and longer periods required for developing logic circuits. The same disadvantage is also experienced illustratively in cases where the capacity of the cache memory and observation signals need to be changed.

Another disadvantage of the prior art is that, because of their slow operating speeds, rewritable programmable chips used as PGAs are not fit for logic circuit emulation at desired speeds.

Although FIG. 2 shows an example in which the logic emulation system is composed of programmable chips, logic circuit emulation is also available by use of integrated circuits that are not programmable. The latter case, however, requires altering the connections between parts on the printed-circuit board since some parts on the printed-circuit board need to be added or removed, and/or wiring patterns need to be cut and jumper wires added where necessary. These steps also add to the growing man-hours.

SUMMARY OF THE INVENTION

It is therefore an object of the present invention to provide a logic emulation system that makes it easy to implement simple logical changes, alterations of the cache memory capacity, and changes in observation signals for performance evaluation, whereby the efficiency of logic emulation is enhanced.

In carrying out the invention and according to one aspect thereof, a logic emulation system constructed according to the teachings of the present invention includes dividing means for dividing the design data on a logic circuit into LSI mapping data representing a plurality of small-scale circuits and PGA connection data for connecting the LSI mapping data. The LSI mapping data and the PGA connection data are mapped into programmable chips, thereby generating an equivalent circuit of the logical circuit. The invention further includes judging means for comparing the design data on the logic circuit having logical changes made thereto with the design data on the logic circuit prior to the logical changes, the latter design data having been generated from the LSI mapping data and from the PGA connection data. The judging means further judges whether it is feasible to implement the logically changed logic circuit by adding small-scale circuits and by changing the PGA connection data. Thus, if the implementation of the logically changed logic circuit is judged to be feasible, the dividing means generates the LSI mapping data on the added small-scale circuits as well as the changed PGA connection data while the data thus generated are mapped into programmable chips, thereby generating an equivalent circuit of the logically changed logic circuit.

In a preferred structure according to the invention, the logic emulation system includes means for generating the design data on the logic circuit in two portions, one portion comprising fixed logic blocks for which there is a low probability that changes in specifications will occur, the other portion comprising variable logic blocks for which there is a higher probability that changes in specifications will occur, wherein the design data on the variable logic blocks are mapped into programmable chips independently of the design data on the fixed logic blocks. The "higher probability" is considered to be substantially higher than the "low probability", the "low probability" representing an expectation that no changes will occur, and the "higher probability" representing an expectation that changes may occur.

In another preferred structure according to the invention, the logic simulation system includes an observation device for observing input/output signals of the programmable chips, and storing means for storing observation signal data representing those input/output pins of the programmable chips which are to be connected to the observation device. On the basis of the observation signal data, observation device connection data are generated and mapped into a programmable chip for observation.

As outlined above, where the target logic circuit is changed in logic, the logic emulation system judges whether any of such changes can be addressed by simply adding a programmable chip or chips for correction. Any time a logical change can be handled by adding an appropriate programmable chip, there is no need for all of the LSI mapping data to be revised from the beginning. This feature facilitates logic emulation, and thereby reduces the man-hours required for the emulation process.

The design data on the variable logic blocks to which changes in specifications may occur are mapped in programmable chips independently of the other logic blocks. This means that changes in the specifications of the logic circuit may be addressed by simply resetting the applicable programmable chip. This feature reduces the man-hours for making the specification design of the logic circuit.

Furthermore, the inventive logic emulation system permits the use of an independently furnished connection data chip that is connected with the observation device. This feature allows the observed values from logic emulation to be checked easily.

The inventive logic emulation system places the LSI mapping data for correction into rewritable programmable chips, and places the LSI mapping data prior to the logical changes into write-once programmable chips or integrated circuit chips. This makes it possible to perform logic simulation at a speed close to that of the actual circuit.

BRIEF DESCRIPTION OF THE DRAWINGS

FIGS. 8(a), 8(b), 8(c) and 8(d) are views showing details of portions of the embodiment shown in FIGS. 3(a) and 3(b);

DETAILED DESCRIPTION OF THE PREFERRED EMBODIMENTS

Preferred embodiments of the invention will now be described with reference to the accompanying drawings.

Figure 1:
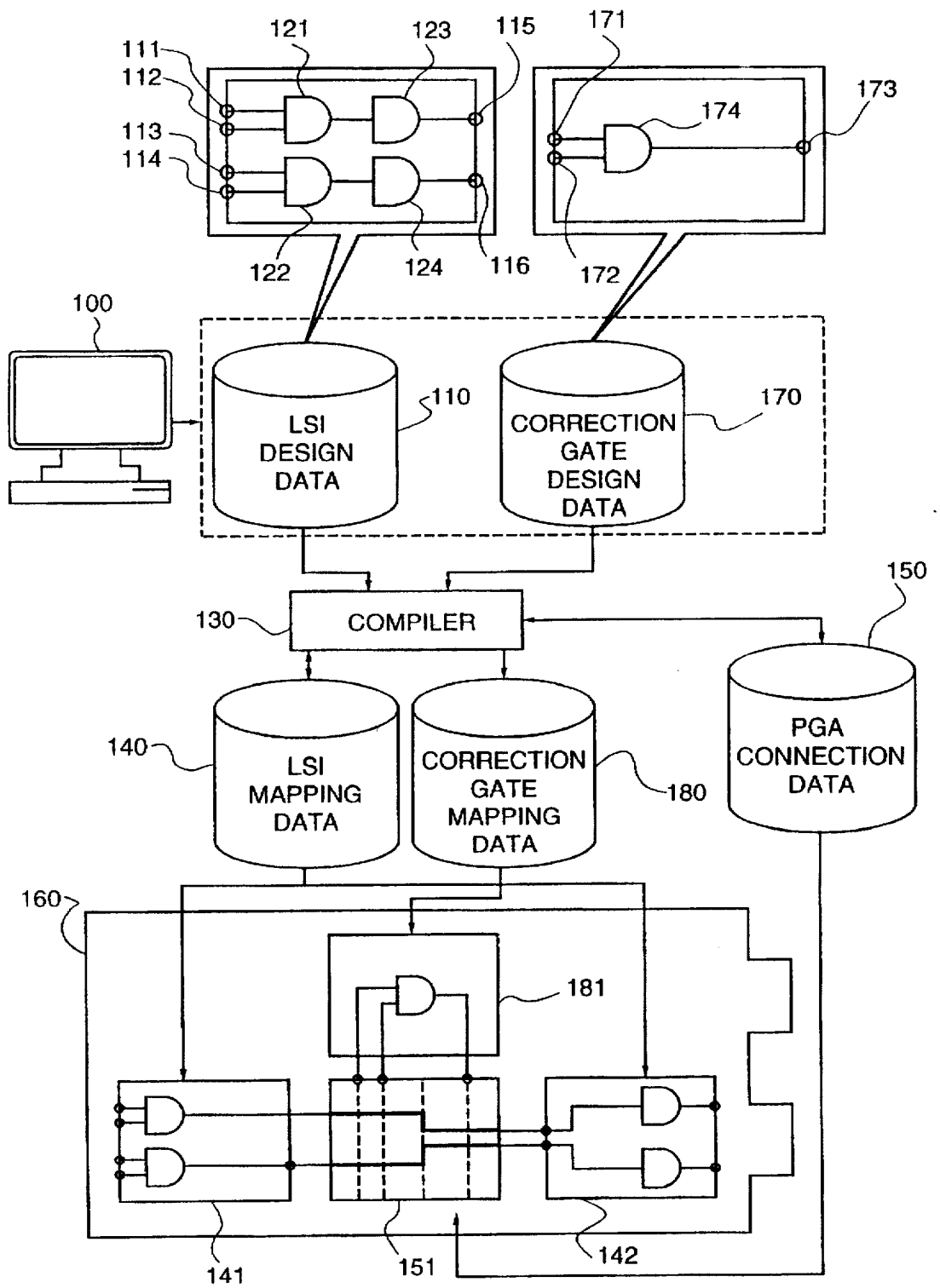
FIG. 1 is an overall block diagram of a logic emulation system embodying the invention.
Figure 3A:
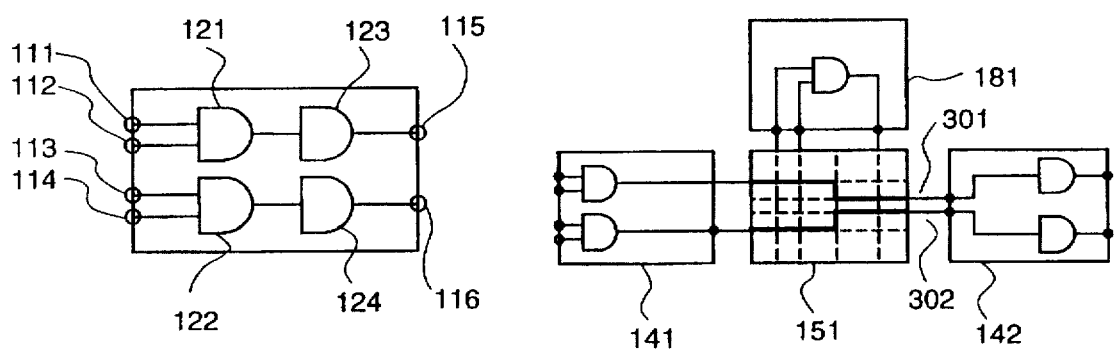
FIGS. 3(a) and 3(b) are views showing how a logical change is made to the programmable chip status in the embodiment of FIG. 1.
Figure 3B:
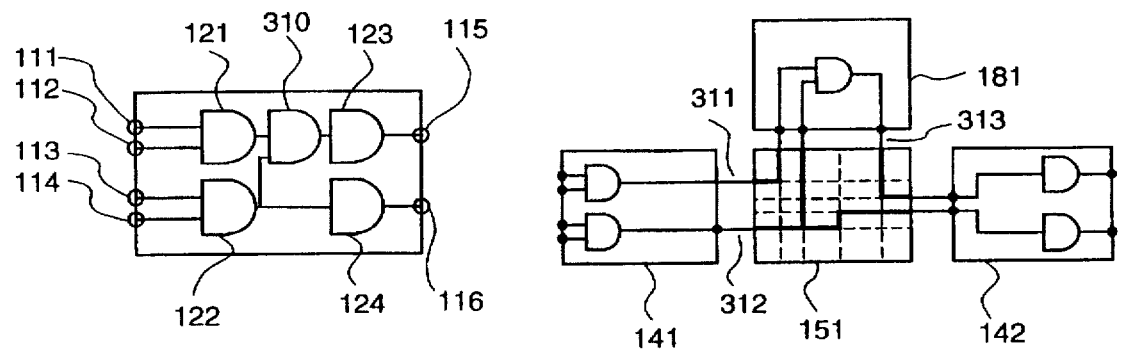
Figure 4:
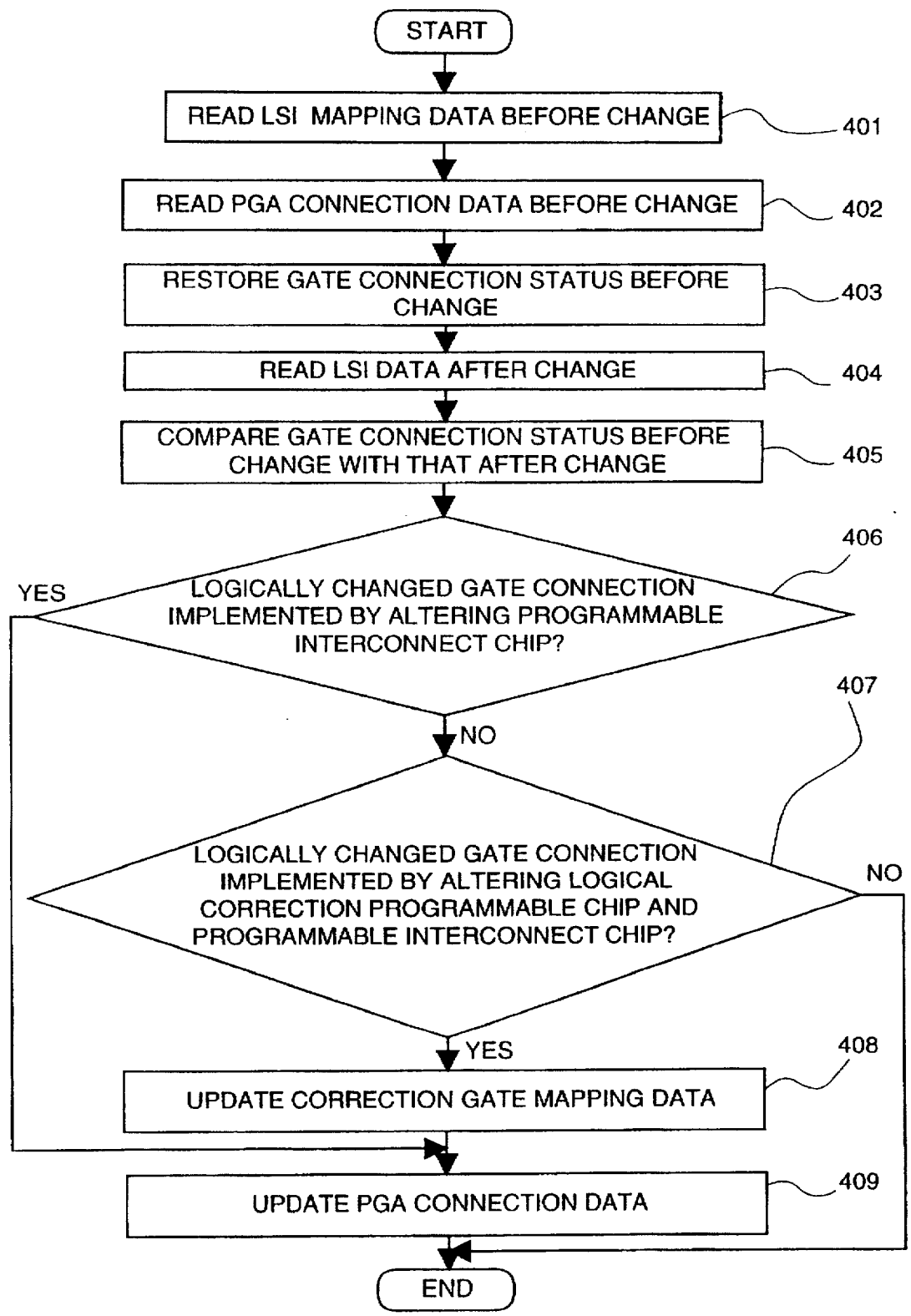
FIG. 4 is a flowchart of steps for logic emulation performed according to the embodiment of FIG. 1.

First, a simple logical change will be described according to a preferred embodiment of the invention as illustrated in FIGS. 1, 3 and 4.

Figure 2:
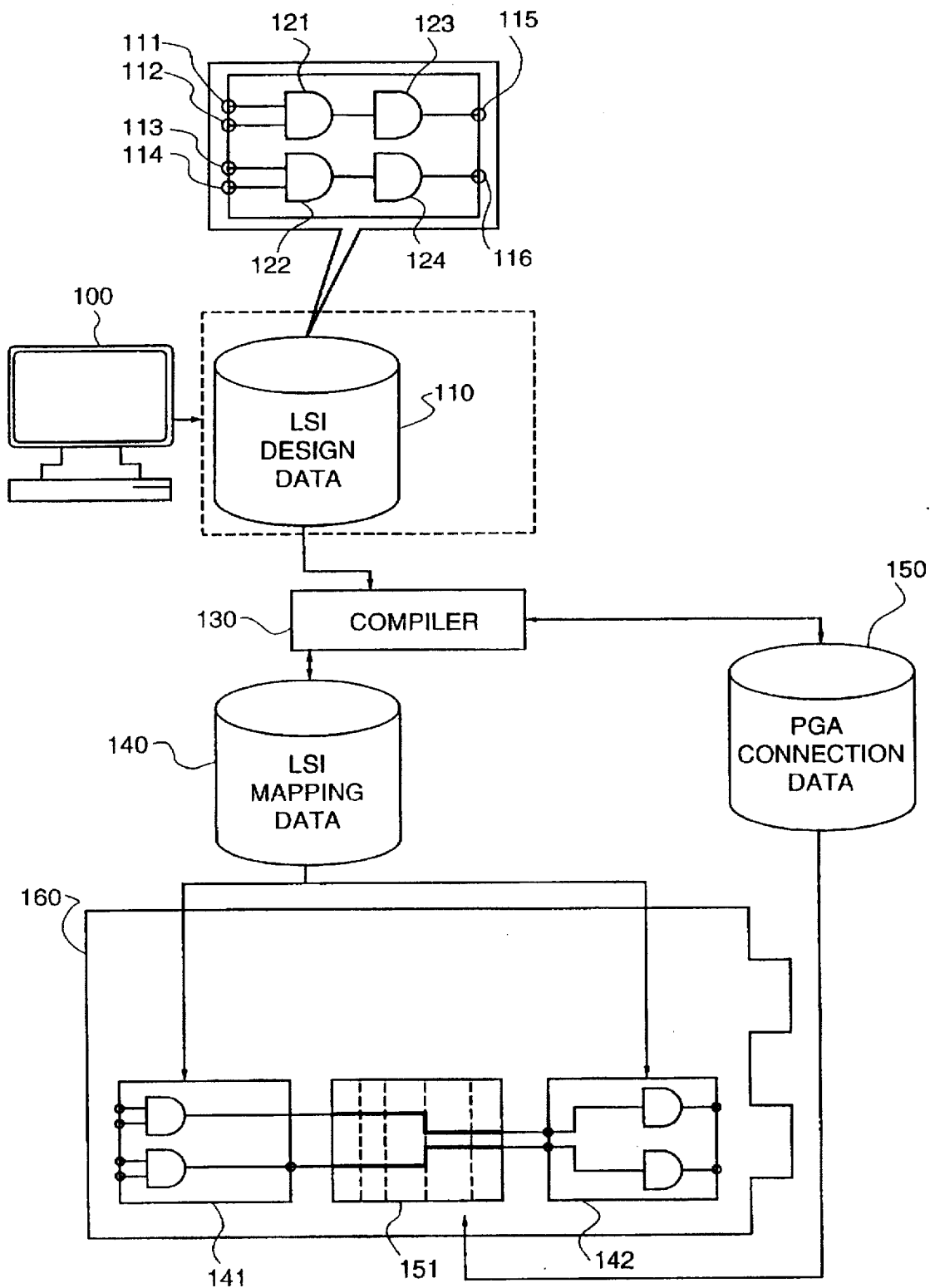
FIG. 2 is an overall block diagram of a conventional logic emulation system.

In FIGS. 1 and 2, like reference numerals 10 through 160 denote like or corresponding parts. Reference numerals 170 and higher represent component parts or resources added in accordance with the teachings of the invention.

Correction gate design data 170 serve as the basis for preparing a logical correction programmable chip. According to this embodiment, the logical correction programmable chip initially has a gate circuit composed of input/output pins 171 through 173 and a gate 174. In practice, the logic to be embodied in the logical correction programmable chip may be determined after a logical change has become necessary following the detection of a logical failure from logic emulation. Correction gate mapping data 180 generated on the basis of the correction gate design data 170 are used to map a logical correction programmable chip 181 (PGA3).

The programmable interconnect chip (PID) 151 is mapped by the compiler 130 so that the output terminals of the programmable chip 141 are connected with the input terminals of the programmable chip 142, as indicated by reference numerals 301 and 302 in FIG. 3(a).

In the event that verification through logic emulation has detected a logical failure, making it necessary to have the output signals of the gates 121 and 122 pass through a gate 310 to enter the gate 123 as shown in FIG. 3(b), the necessary logical change is implemented by the logic emulation system of the invention as follows.

With reference to FIG. 4, the compiler 130 initially reads the LSI mapping data 140 and PGA connection data 150 (steps 401 and 402). Having read the data, the compiler 130 internally restores (i.e., remakes or regenerates) the gate connection status in effect before the logical change (step 403). The compiler 130 then reads the LSI design data 110 after the logical change (step 404), and compares the gate connection status before the change with the gate connection after the change (step 405). If the comparison indicates that the logical change may be implemented by altering the programmable interconnect chip 151 so as to have the gate of the logical correction programmable chip 181 (step 406) connected, the compiler 130 updates the PGA connection data alone (step 409). With this embodiment, the compiler 130 updates the PGA connection data 150 so as to make the connections indicated by numerals 311 through 313 in FIG. 3(b).

Possibly, the logical change cannot be implemented by altering the programmable interconnect chip 151 alone, illustratively because of the absence of a logical correction gate necessary for the logical correction programmable chip 181. In such a case, the compiler 130 checks to see if the logical change may be implemented by altering the logical correction programmable chip 181 and programmable interconnect chip 151 (step 407). If the implementation of the logical change is found to be feasible in step 407, the compiler 130 carries out the logical change by altering the correction gate mapping data 180 and PGA connection data 150. If the implementation of the logical change is not found feasible in step 407, the LSI mapping data 140 and the PGA connection data 150 need to be generated anew from the LSI design data 110.

Step 403 and subsequent steps will now be described in more detail with reference to FIGS. 8(a) through 8(d).

FIG. 8(a) shows the gate connection state in effect before the logical change, the state being restored by the compiler 130 from the LSI mapping data 140 and PGA connection data 150. (The LSI mapping data and PGA connection data before the logical change are shown in FIGS. 9 and 10(a) –10(c).) In FIGS. 8(a) through 8(d), reference characters S1 through S8 are signal names given to the signals connected to the gates; AND1 and AND2 are function names denoting the functions of the furnished gates, AND1 and AND2 being a one-input and a two-input AND gate respectively; I1, I2, and O1 are gate pin numbers.

FIG. 8(b) shows how the logical connection state of FIG. 8(a) is defined by the signal names representing the signals connected to each of the gates. The data structure of this logical connection state is the same as that of the LSI data 110.

FIG. 8(c) shows the gate connection state, read in step 404, of the LSI design data 110 following the logical change, and FIG. 8(d) gives the data structure of the logical connection state in FIG. 8(c).

In step 405, the compiler 130 judges that an AND gate AND2 (AND2-3) has been added and that the signal name of the signal connected to pin O1 of AND2-1 has been changed from S5 to X1.

In step 406, with the added two-input AND gate (AND2) residing in the logical correction programmable chip 181, the compiler 130 judges that the logical change may be carried out by getting the programmable interconnect chip 151 to furnish signals S5, S6 and X1. Step 409 for altering the programmable interconnect chip 151 is thus performed accordingly. However, if the added gate is an OR gate, that gate does not exist in the logical correction programmable chip 181. In that case, the compiler 130 passes control from step 407 to step 408, in which mapping data are prepared in the logical correction programmable chip 181, for generating the OR gate according to known practices. Step 408 is followed by step 409 in which the programmable interconnect chip 151 is altered.

Figures 9A, 9B, 9C, 9D:
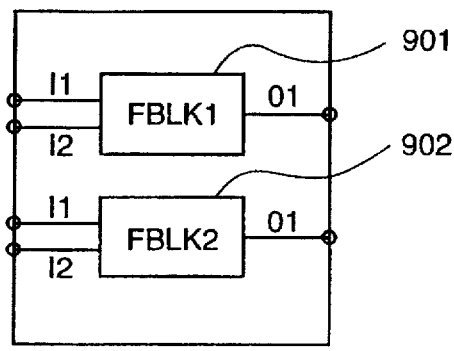
FIGS. 9(a), 9(b), 9(c) and 9(d) are views depicting mapping data.

FIGS. 9(a) through 9(d) and 10(a) through 10(c) show exemplary contents of the LSI mapping data 140, correction gate mapping data 180 and PGA connection data 150. FIG. 9(a) indicates the structure of programmable chips used by the embodiment. Each programmable chip comprises two function blocks 901 and 902 (FBLK1, FBLK2). One function block is capable of implementing combinational logic of up to 2 inputs and 1 output.

FIGS. 9(b) through 9(d) show the mapping data for defining the functions of the function blocks 901 and 902 (FBLK1, FBLK2). The mapping data represent in a truth table format the function block numbers indicating the function blocks as well as the functions to be implemented by each of the function blocks. FIG. 9(b) shows the LSI mapping data for the programmable chip 141 (PGA1), FIG. 9(c) lists the LSI mapping data for the programmable chip 142 (PGA2), and FIG. 9(d) indicates the correction gate mapping data for the logical correction programmable chip 181 (PGA3).

A bar (−) in the column I2 under "Input" indicates that the input I2 is not used and that a single-input function is implemented by the programmable chip 142. In FIG. 9(d), the absence of 2s in the function block number column means that the programmable chip 181 is implemented by a single function block (FBLK1). Although the programmable chips of this invention are simple in structure, the function blocks (FBLK) may be more complicated structurally, comprising flip-flops and interconnecting lines between function blocks so as to implement more sophisticated functions.

Figure 10A:
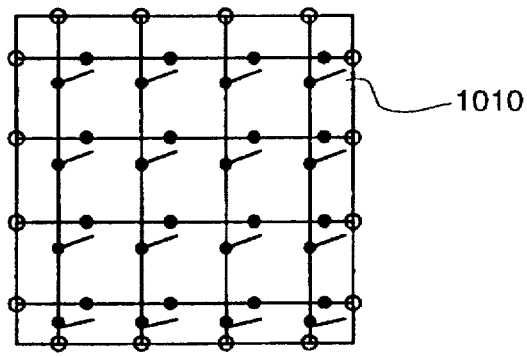
FIGS. 10(a), 10(b) and 10(c) are views showing PGA connection data.

FIG. 10(a) shows the structure of the programmable interconnect chip. With this embodiment, four vertical lines intersect four horizontal lines. The connection between any two lines is established or broken by a cross point switch 1010 located at each point of intersection.

Figure 10B:
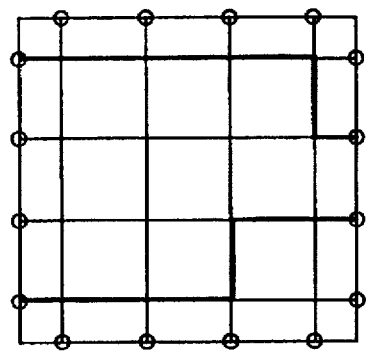
Figure 10C:
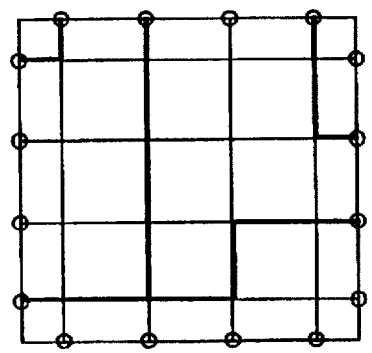

With further reference to FIGS. 3(a) and 3(b), respectively, FIGS. 10(b) and 10(c) show the PGA connection data before and after the logical change, respectively. In the figures, a 1 means that the cross point switch in question is turned on to change the wiring route; a 0 indicates that the cross point switch remains off to let the line route remain unchanged (i.e., straight route). The programmable interconnect chip is of a known type (e.g., PID IQ160, of the Xilinx XC4000 family), and thus no mention is made of the procedures for giving orders to change the line direction. The compiler alters the programmable interconnect chip by varying the truth table contents as needed.

For this embodiment, the programmable chips 141 and 142 are rewritable chips. It should be noted that some programmable chips are unrewritable. These chips must be replaced as needed on the printed-circuit board.

To increase further the operating speed of emulation requires preferably two things: that the fixed logic blocks on which the logic circuit information is not changed are implemented illustratively using an anti-fuse type programmable chip that operates faster than rewritable programmable chips; and that the variable logic blocks on which the logic circuit information may be changed are implemented using a slow-operating but rewritable programmable chip.

With the above setup in place, the operating speed of the emulated circuit is made closer to that of the actual circuit for logic verification. A simple logical change is thus handled easily by this setup for emulation.

Figure 7:
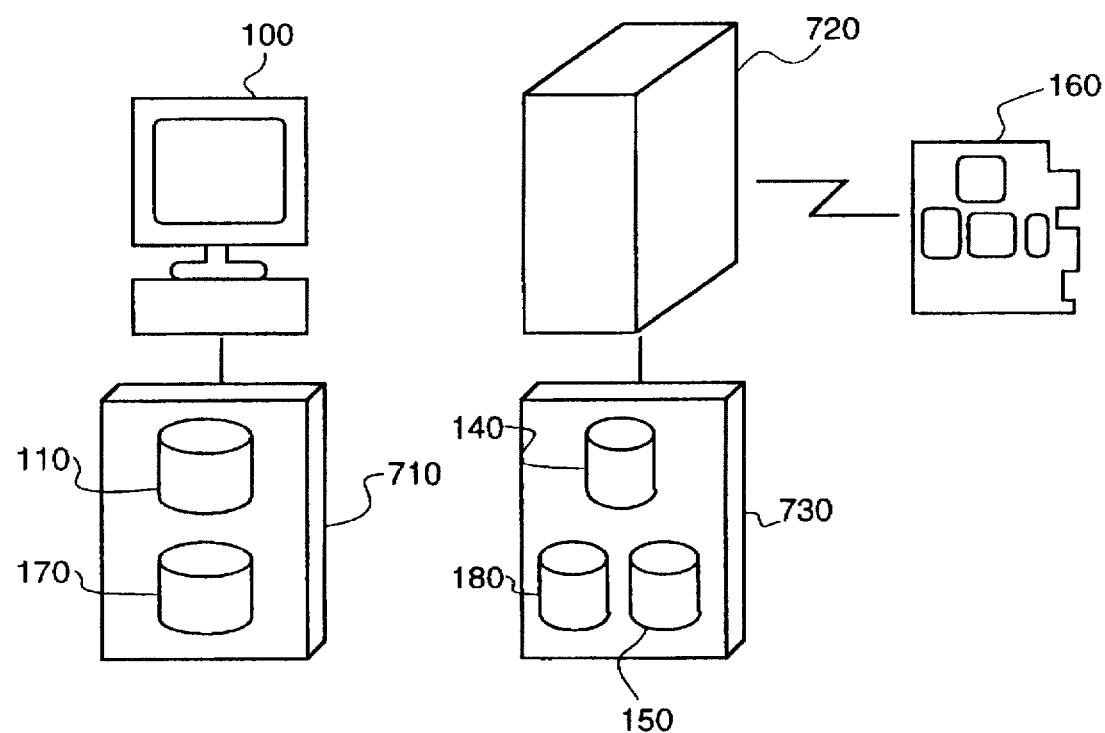
FIG. 7 is a view of a hardware configuration for the embodiment shown in FIG. 1.

FIG. 7 shows an example of a hardware configuration of this embodiment. Workstation 100 compiles the LSI design data 110 and correction gate design data 170 stored on a hard disc drive 710, and generates therefrom the LSI mapping data 140, correction gate mapping data 180, and PGA connection data 150. The generated data are sent to an emulation controller 720. The emulation controller 720 stores the received LSI mapping data 140, correction gate mapping data 180, and PGA connection data 150 onto a hard disk drive 730. At the same time, the emulation controller 720 maps these three kinds of data in programmable chips mounted on the printed-circuit board 160 to prepare an equivalent circuit of the target logic circuit.

As described, this embodiment realizes simple logical changes using a programmable interconnect chip that connects the logic correction gates furnished in the logic correction programmable chip with the emulation logic integrated circuits.

Another embodiment of the invention, which alters the capacity of the cache memory and changes observation signals, will be described with reference to FIGS. 5 and 6.

Figure 5:
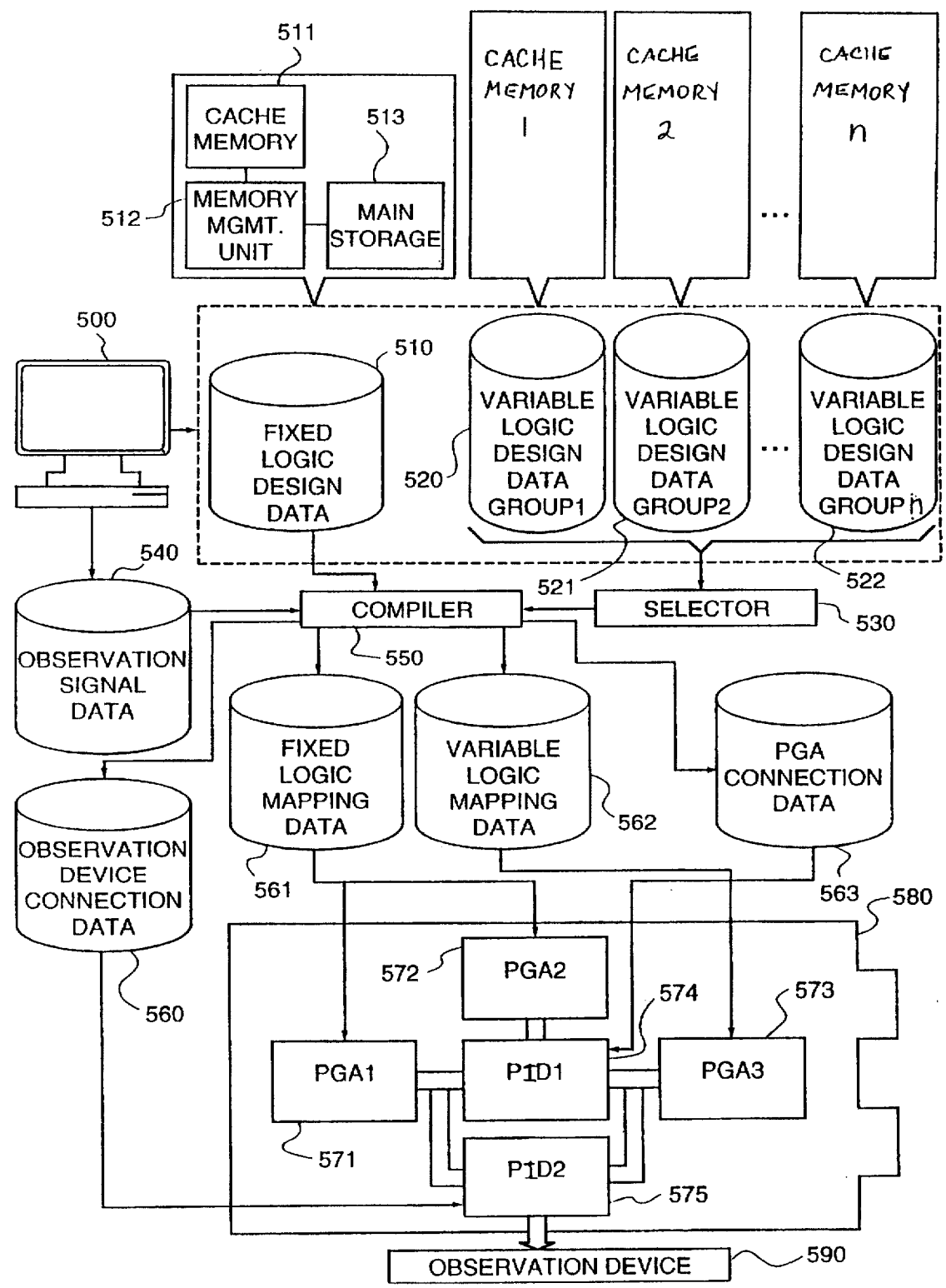
FIG. 5 is a view of the system configuration of another logic emulation system embodying the invention, for changing the cache memory capacity and observation signals.

FIG. 5 shows the system configuration of this embodiment. A workstation 500 inputs the design data regarding the fixed and variable logic blocks of the target system whose performance is to be evaluated. The embodiment of FIG. 5 evaluates illustratively a computer system comprising a memory management unit (MMU) 512 and a main storage (MS) 513. The data representing the blocks excluding the cache memory and its peripheral logic constitute fixed logic blocks that are stored in a fixed logic design data portion 510. The cache memory and its peripheral logic constitute variable logic blocks that are stored in variable logic design data portions.

Before logic verification, the workstation 500 is used to input observation signal data 540 designating which of the input/output pins of the furnished programmable chips are to be connected to an observation device 590 for observation.

The peripheral logic of the cache memory refers illustratively to a cache directory and high-speed retrieval logic for establishing correspondence between the cache memory and the main storage; control logic for transferring the target data from the main storage to the cache memory in the case of a miss within the latter; and control logic for updating the main storage in a store-through manner at the same time that the cache memory is updated.

Different groups of variable logic design data are held in cache memory divisions of different capacities (520 through 522). A selector 530 selects any one of the variable logic design data groups 520 through 522 and sends it to a compiler 550.

The compiler 550 reads the fixed logic design data 510 and generates therefrom fixed logic mapping data 561 and PGA connection data 563 needed to prepare programmable chips 571 and 572 (PGA1, PGA2) as well as a programmable interconnect chip 574 (PID1). The programmable chips 571 and 572 perform operations equivalent to those of the fixed logic blocks, and the programmable interconnect chip 574 interconnects the programmable chips.

In addition, the compiler 550 generates variable logic mapping data 562 needed to prepare a programmable chip 573. The programmable chip 573 performs operations equivalent to those of the variable logic block selected by the selector 530 from among the variable logic design data groups 520 through 522. On the basis of the observation signal data 540, the compiler 550 generates observation device connection data 560 needed to prepare an observation signal selecting programmable chip 575 (PID2).

The programmable chip 575 selects the observation signals for connecting the selected input/output pins of the programmable chips 571 through 573 with the observation device 590. For logic emulation, the programmable chips 571 through 573, programmable interconnect chip 574, and observation signal selecting programmable chip 575 are mounted on a printed-circuit board 580. The mounted chips are operated at speeds close to the actual operating speed of the target logic circuit, whereby the performance of the latter is evaluated.

Figure 6:
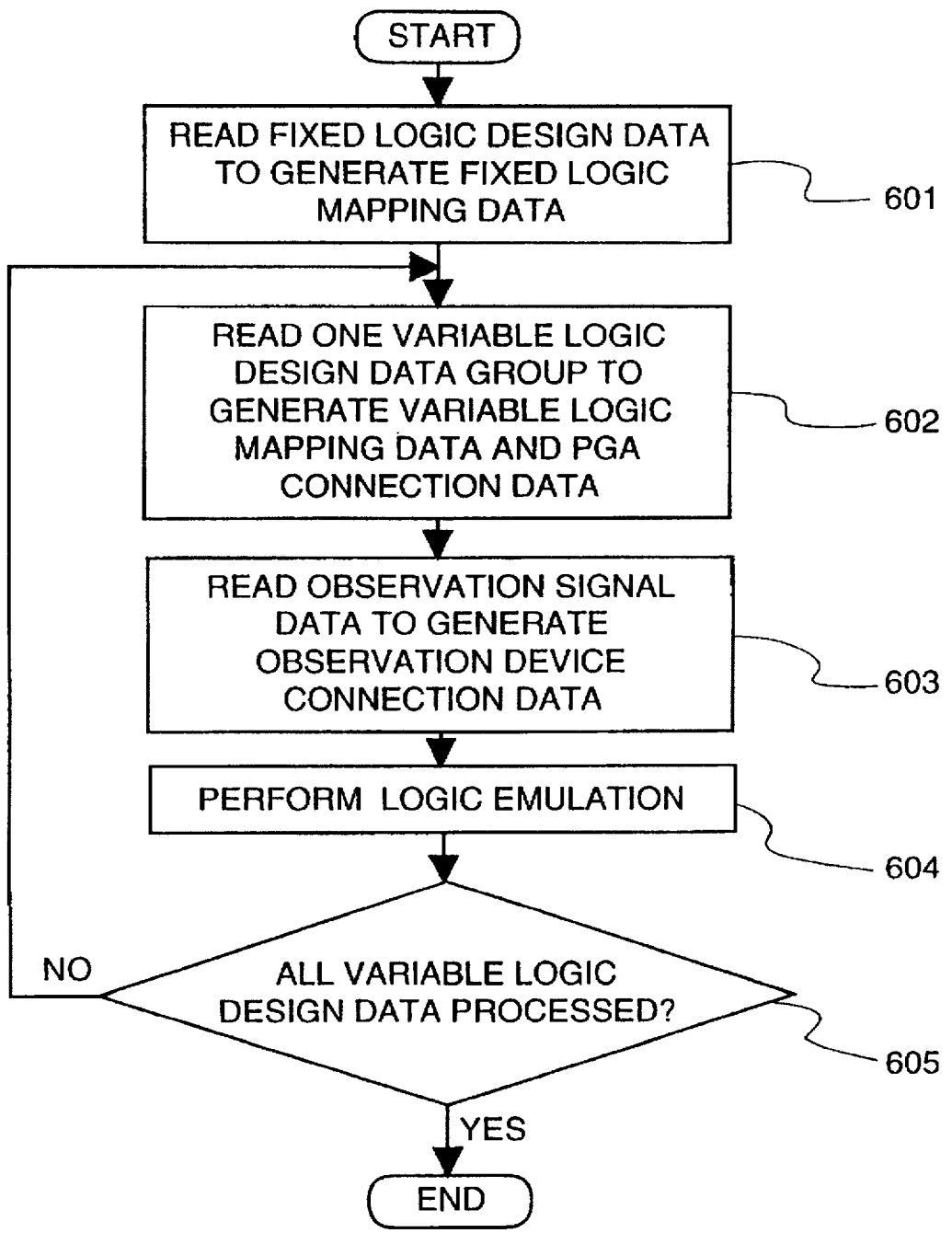
FIG. 6 is a flowchart of steps for logic emulation performed according to the embodiment of FIG. 5.

FIG. 6 shows exemplary logic emulation steps for performance evaluation, carried out while the variable logic design data groups 520 through 522 are being switched from one group to another. Initially, the compiler 550 reads the fixed logic design data 510 to generate therefrom the fixed logic mapping data 561 (step 601). The compiler 550 then reads the variable logic design data group 522 to generate the variable logic mapping data 562 (step 602). With the mapping data 562 thus generated, the compiler 550 reads the observation signal data 540 to generate the observation device connection data 560 (step 603).

After logic emulation is carried out (step 604), the selector 530 replaces the current variable logic design data group 520 with one of the remaining variable logic design data groups 521 and 522. For each data group, steps 602 through 604 are repeated (step 605). The switching of the variable logic design data groups is accomplished at constant intervals by use of a timer function within the system.

In the logic emulation system of FIG. 5, a plurality of observation signal data may be provided, and an observation time may be set for each of the multiple observation signal data. In operation, the compiler generates observation device connection data at each set time and maps the generated data in an observation-oriented programmable chip. This feature allows the point of observation to be changed automatically.

In logic design, the above embodiment makes it easier to design the variable logic block specifications of the target logic circuit. In this connection, an optimum cache memory capacity becomes easier to design.

Furthermore, the observation signal selecting programmable chip is used to select as desired the observation signals for connecting the appropriate input/output pins of the emulation logic integrated circuits and of the logic correction programmable chip with the observation device. That is, the invention makes it easier to change the observation signals.

As described above, the logic emulation system according to the invention facilitates the execution of simple logical changes, including changes of the cache memory capacity for performance evaluation and changes of observation signals in preferred embodiments. The inventive features combine to significantly improve the efficiency of logic simulation.

Various modifications to the apparatus disclosed in the foregoing description will become apparent to one of ordinary skill in the art. All such modifications that basically rely upon the teachings by which the present invention has advanced the state of the art are properly considered within the spirit and scope of the invention, as defined by the following claims.

We claim:

1. A logic emulation system comprising:

dividing means for dividing the design data on a logic circuit into LSI mapping data representing a plurality of small-scale circuits and PGA connection data for connecting said LSI mapping data;

mapping means for mapping said LSI mapping data and said PGA connection data into programmable chips thereby generating an equivalent circuit of said logical circuit; and judging means for comparing the design data on said logic circuit having logical changes made thereto, with the design data on said logic circuit prior to said logical changes, the latter design data been generated from said LSI mapping data and from said PGA connection data, said judging means further judging whether it is feasible to implement the logically changed logic circuit by adding small-scale circuits and by changing said PGA connection data;

wherein, if the implementation of said logically changed logic circuit is judged to be feasible, said dividing means generates the LSI mapping data on the added small-scale circuits as well as the changed PGA connection data, and said mapping means maps the data thus generated into programmable chips, thereby generating an equivalent circuit of said logically changed logic circuit.

2. A logic emulation system according to claim 1, wherein said judging means judges feasibility of implementing said logically changed logic circuit by comparing the design data representing said logically changed logic data with the types of gates and signal lines connected to said gates, the gate types and the signal line connections being included in said LSI mapping data and said PGA connection data.

3. A logic emulation system according to claim 2, wherein the LSI mapping data representing said added small-scale circuits are placed into rewritable programmable chips, whereas the LSI mapping data representing said logic circuit prior to said logical changes are placed into one of two types of chips selected from the group consisting of write-once programmable chips and integrated circuit chips.

4. A logic emulation system as claimed in claim 1, wherein, if the implementation of said logically changed logic circuit is judged to be feasible, said dividing means generates the LSI mapping data representing the added small-scale circuits as well as the changed PGA connection data without generating new LSI mapping data for the entire logic circuit.

5. A logic emulation system, comprising:

dividing means for dividing design data representing a logic circuit into design data representing a plurality of small-scale circuits, and design data representing a connection circuit for connecting said small-scale circuits;

equivalent circuit generating means for generating an equivalent circuit of said logic circuit by use of said small-scale circuits and said connection circuit; and input means for inputting said design data representing said logic circuit in two portions, including a first portion comprising fixed logic blocks having a first probability of occurrence of changes in specifications thereto, and a second portion comprising variable logic blocks having a second probability of occurrence of changes in specifications thereto, said second probability being substantially higher than said first probability;

wherein said dividing means generates said variable logic blocks as a single small-scale circuit independent of said fixed logic blocks.

6. A logic emulation system according to claim 5, further comprising:

storing means for storing a plurality of design data representing said variable logic blocks of said logic circuit; and selecting means for selecting the design data representing any one of said variable logic blocks;

wherein said dividing means generates the design data representing the variable logic block selected by said selecting means as the design data denoting a single small-scale circuit.

7. A logic emulation system according to claim 5, further comprising:

mapping means for mapping into programmable chips the design data representing the small-scale circuits generated by said dividing means;

an observation device for observing input/output signals of said programmable chips; and storing means for storing observation signal data representing those input/output pins of said programmable chips which are to be connected to said observation device;

wherein said dividing means generates, on the basis of said observation signal data, observation connection data representing a connection circuit for connecting said observation device with said programmable chips, said mapping means mapping said observation connection data into a programmable chip for observation.

8. A logic emulation system according to claim 7, wherein said storing means stores a plurality of observation signal data and the observation times set for each of said observation signal data; and wherein said dividing means generates said observation connection data at each of the set times, said mapping means mapping the generated observation connection data into said programmable chip for observation.

9. An equivalent circuit generating method for use with a logic simulation system that stores design data representing a logic circuit and generates a plurality of small-scale circuits from the design data representing said logic circuit, to thereby generate an equivalent circuit of said logic circuit, said equivalent circuit generating method comprising the steps of:

judging, when a logical design change to the logic circuit prompts a comparison of information concerning the equivalent circuit of said logic circuit before said logic circuit is logically changed with information concerning said logic circuit after said logic circuit is logically changed, feasibility of implementing the design data representing the logically changed logic circuit by adding at least one small-scale circuit and by furnishing an altered connection circuit; and generating, when the implementation of the design data representing said logically changed logic circuit is judged to be feasible, said equivalent circuit of said logically changed logic circuit by adding at least one small-scale circuit and by furnishing the altered connection circuit without changing other small-scale circuits in effect prior to said logical design change to said logic circuit.

10. A logic emulation system for implementing operations equivalent to those of a logic circuit, comprising:

emulation logic integrated circuit elements for implementing operations of said logic circuit, including at least one of two kinds of programmable chips selected from the group consisting of unrewritable integrated circuit chips and rewritable programmable chips;

at least one logic correction programmable chip for implementing operations of a logic correction circuit which is a reserved circuit;

a programmable interconnect chip for interconnecting the emulation logic integrated circuit elements, and for interconnecting an emulation logic integrated circuit element with a logic correction programmable chip; and means for implementing operations of said logic circuit by use of said emulation logic integrated circuit elements, of said logic correction programmable chip, and of said programmable interconnect chip.

11. A logic emulation system according to claim 10, further comprising:

designating means for designating within an emulation logic circuit a fixed logic block portion and a variable logic block portion, said fixed and said variable logic block portions being formed respectively in said emulation logic integrated circuit elements and in said logic correction programmable chip; and dividing means for dividing said emulation logic circuit as designated by said designating means so as to furnish said fixed logic block portion in said emulation logic integrated circuit elements, and to furnish said variable logic block portion in said logic correction programmable chip.

12. A logic emulation system according to claim 11, wherein said emulation logic integrated circuit elements include at least one of two kinds of circuit devices selected from the group consisting of unrewritable integrated circuits and write-once programmable chips, and wherein said logic correction programmable chip is constituted by a rewritable programmable chip.

13. A logic emulation system according to claim 10, further comprising:

designating means for designating within an emulation logic circuit a fixed logic block portion and a variable logic block portion, said fixed and said variable logic block portions being formed respectively in said emulation logic integrated circuit elements and in said logic correction programmable chip;

dividing means for dividing said emulation logic circuit as designated by said designating means so as to furnish said fixed logic block portion in said emulation logic integrated circuit elements, and to furnish said variable logic block portion in said logic correction programmable chip;

holding means for holding a plurality of logic circuit data representing said variable logic block portion; and selecting means for selecting one of said logic circuit data and placing it into said logic correction programmable chip.

14. A logic emulation system according to claim 10, wherein said emulation logic integrated circuit elements include at least one of two kinds of circuit devices selected from the group consisting of unrewritable integrated circuits and write-once programmable chips, and wherein said logic correction programmable chip is constituted by a rewritable programmable chip.

15. A logic emulation system according to claim 10, further comprising a plurality of said logic correction programmable chips, wherein the programmable interconnect chip further interconnects the logic correction programmable chips.

16. A logic emulation system for implementing operations equivalent to those of a logic circuit by use of a plurality of component parts mounted on a printed-circuit board, thereby emulating the logic operations of said logic circuit, said logic emulation system comprising:

an observation signal selecting programmable chip for selecting observation signals from among the input/output pins of said component parts, and for connecting the selected observation signals to an observation device;

designating means for designating the input/output pins for observation and the observation times for the designated input/output pins; and implementing means for implementing observation signal connection logic in said observation signal selecting programmable chip as designated by said designating means.

* * * * *